United States Patent [19]

Shin

[11] Patent Number: 5,732,028

[45] Date of Patent: Mar. 24, 1998

[54] REFERENCE VOLTAGE GENERATOR MADE OF BIMOS TRANSISTORS

[75] Inventor: Yun-Seung Shin, Kyungki-do, Rep. of Korea

[73] Assignee: Samsung Electronics Co., Ltd., Suwon, Rep. of Korea

[21] Appl. No.: 758,646

[22] Filed: Nov. 27, 1996

[30] Foreign Application Priority Data

Nov. 29, 1995 [KR] Rep. of Korea .................. 95-44850

[51] Int. Cl.[6] .................. G11C 7/00; G05F 3/20
[52] U.S. Cl. .................. 365/189.09; 365/189.11; 327/540; 323/313
[58] Field of Search .................. 365/189.09, 189.11; 327/543, 540, 542; 323/313

[56] References Cited

U.S. PATENT DOCUMENTS

| | | | |
|---|---|---|---|
| 4,914,634 | 4/1990 | Akrout et al. | 365/189.09 |
| 5,109,187 | 4/1992 | Guliani | 365/189.09 |
| 5,245,273 | 9/1993 | Greaves et al. | 365/189.09 |
| 5,384,740 | 1/1995 | Etoh et al. | 365/189.09 |

OTHER PUBLICATIONS

Bipolar and MOS Analog Integrated Circuit Design; by Alan B. Grebene, Micro-Linear Corproation, Sunnyvale, California; A Wiley-Interscience Publication, John Wiley & Sons.

Primary Examiner—Son T. Dinh

[57] ABSTRACT

There is disclosed a reference voltage generator in a semiconductor device comprising first and second power ports to which first and second power supplies are independently provided, a filter connected between the first and the second provided, a filter connected between the first and the second power ports for filtering a component of the first power supply from the first power port to provide a filtered power supply to the inner power supply node, a first pull-up transistor having a current route formed between the inner power supply node and a predetermined first connection node and a control port connected to a predetermined second connection node, a second pull-up transistor having a current route formed between the inner power supply node and the second connection node and a control port connected to the second connection node, a third pull-up transistor having a current route formed between the inner power supply node and a reference voltage output node and a control port connected to the second connection node, a first pull-down transistor having a current route formed between the first connection node and the second connection node and a control port connected to the first connection node, a second pull-down transistor having a current route formed between the second connection node and the second connection node and a control port connected to the first connection node having current restricting resistance, and a loading unit formed between the reference voltage output node and the second power supply port.

33 Claims, 7 Drawing Sheets

5,732,028

REFERENCE VOLTAGE GENERATOR MADE OF BiMOS TRANSISTORS

BACKGROUND OF THE INVENTION

The present invention relates to a reference voltage generator for generating reference voltage that is used in a semiconductor device such as a dynamic RAM and an analog-to-digital converter. More particularly, the present invention relates to a reference voltage generator made of bipolar and MOS transistors (hereinafter, called BiMOS transistors).

The present application for a reference voltage generator made of BiMOS transistors, is based on Korean Application No. 44850/1995 which is incorporated herein by reference for all purposes.

A semiconductor device generally operates using an external power supply voltage and has either a constant voltage circuit or a reference-voltage generator for accurately converting the externally-provided power supply to an operation voltage used by the circuits inside the chip. It is apparent to technicians skilled in this field that it is important to accurately maintain the inner operation voltage of a semiconductor to secure the stable operation of devices in the chip and the reliability of the devices. It is essential to maintain a continuous power level at all periods of operation to make each device perform its intrinsic function in a more stable manner without affecting the inside of the chip when the external power supply voltage alters. A conventional reference voltage generator made of BiMOS transistors will now be described referring to FIG. 1.

In a circuit structured as shown in FIG. 1, a first power supply voltage and a second power supply voltage are provided from the outside, e.g., power supply voltage $V_{cc}$ and ground potential $V_{ss}$. The reference voltage $V_{ref}$ generated from output node $N_3$, is then determined by the following expression (1).

$$V_{ref}=V_{be}+(V_t)(R_2/R_1)(i_2/i_1)(ln[(i_2/i_1)(i_{o(Q2)}/i_{o(Q1)})]) \quad (1)$$

In the expression (1), $V_{be}$ denotes the voltage between the base and emitter of a bipolar transistor $Q_3$, i.e., voltage between a node $N_4$ and ground potential $V_{ss}$. $V_t$ denotes the value of KT/q, approximately 26 mA in normal operating temperatures, where K is the Boltzmann constant, T is the absolute temperature, and q is the absolute value of the charge amount of an electron. $I_2$ and $i_1$ denote currents respectively flowing in each channel between $i_{o(Q2)}$ and $i_{o(Q1)}$, respectively, the collector reverse saturation currents of bipolar transistors $Q_1$ and $Q_2$. These currents are the equivalent to $I_{CO}$ of Eq. (2.6) in "Bipolar and MOS Analog Integrated Circuit Design," pp. 58–63, by Alan B. Grebane, which is herein incorporated by reference.

The ratio of current $i_2/i_1$ corresponds to a constant determined by the ratio $W_n/L_n$ of the channel width $W_n$ with respect to the channel length $L_n$ of the PMOS transistors $M_1$ and $M_2$. For instance, when the $W_1/L_1$ of the PMOS transistor $M_1$ is 10 μm/50 μm, and the $W_2/L_2$ of the PMOS transistor $M_2$ is 50 μm/50 μm, the current ratio, $i_2/i_1$, becomes [(50 μm/50 μm)/(10 μm/50 μm)], or about 5. Similarly, the current ratio $i_3/i_1$ corresponds to a constant determined by the ratio $W_n/L_n$ of the channel width $W_n$ with respect to the channel length $L_n$ of the PMOS transistors $M_3$ and $M_2$. Thus, when the $W_1/L_1$ of the PMOS transistor $M_1$ is 10 μm/50 μm, and the $W_3/L_3$ of the PMOS transistor $M_2$ is 100 μm/50 μm, the current ratio, $i_3/i_1$, becomes [(100 μm/50 μm)/(10 μm/50 μm)], or about 10.

In the circuit of FIG. 1 for generating the reference voltage $V_{ref}$ determined as the expression (1), the level of the output voltage of the reference voltage $V_{ref}$ alters according to the $W_n/L_n$ of each of the PMOS transistors $M_1$, $M_2$, and $M_3$.

However, the voltage reference circuit is not the only circuit drawing power from the external power supply. At various points the total current draw on the external power supply may exceed the maximum allowable current drawn from the external power supply. These periodic overdraws of power may cause a brief drops in the supply voltage $V_{cc}$. Since this is likely to happen at very high frequencies, the voltage drops can pass through the parasitic capacitances $C_{gs}$ and $C_{gd}$ in transistors $M_1$, $M_2$, and $M_3$. The voltage change $\Delta V_{cc}$ occurring at a source ports of each PMOS transistor $M_1$, $M_2$ and $M_3$ is associated with the nodes $N_1$, $N_2$ and $N_3$ through parasitic capacity between the source-gate ports and the source-drain ports of the PMOS transistors $M_1$, $M_2$ and $M_3$. Consequently, voltage fluctuation $\Delta V_{ref}$ can occur in the reference voltage $V_{ref}$ as shown in FIG. 2.

In other words, the low-frequency voltage fluctuation at the power supply voltage $V_{cc}$ port in the conventional reference voltage generator as shown in FIG. 1 enough does not cause any voltage fluctuation of the reference voltage $V_{ref}$ output at the node $N_3$. However, a high-frequency voltage fluctuation at the power supply voltage $V_{cc}$ port causes considerable voltage fluctuation $\Delta V_{ref}$ at the node $N_3$, resulting in a corresponding reduction of the voltage output by the reference voltage generator.

Also, in the structure of FIG. 1, to obtain a plurality of reference voltages having at least one reference voltage, i.e., a different level of the output voltage, reference voltage generators are required as many as necessary to thereby increase power consumption as well as to cause increment of chip lay-out.

SUMMARY OF THE INVENTION

Accordingly, it is an object of the present invention to provide a reference voltage generator for generating a stable reference voltage when power supply voltage causes the fluctuation of a level by a signal component being abandoned by the power supply voltage provided into a semiconductor device from the outside.

It is another object of the present invention to provide a reference generator for generating a stable reference voltage to provide the same to each circuit inside the semiconductor device when the power supply voltage provided into a semiconductor device from the outside changes with a high-frequency component.

It is further another object of the present invention to provide a structure of a reference voltage generator for efficiently generating a plurality of reference voltages having a different output level in the minimum chip area. It is still another object of the present invention to provide a reference voltage generator for generating a stable reference voltage in fast response to the supply of the external power supply voltage.

It is still further another object of the present invention to provide a reference voltage generator for generating a stable reference voltage even if the setting of the initial conditions is wrong when the power supply voltage is applied.

It is another object of the present invention to provide a reference voltage generator which enables to generate a plurality of reference voltages without increasing power consumption.

To achieve these and other objects, there is provided a reference voltage generator in a semiconductor device comprising: first and second power ports to which first and second power supplies are independently provided; filtering unit connected between the first and the second power ports for filtering the first power supply from the first power port to provide to the inner power supply node; a first pull-up transistor having a current route formed between the inner power supply node and a predetermined first connection node and a control port connected to a predetermined second connection node; a second pull-up transistor having a current route formed between the inner power supply node and the second connection node and a control port connected to the second connection node; a third pull-up transistor having a current route formed between the inner power supply node and a reference voltage output node and a control port connected to the second connection node; a first pull-down transistor having a current route formed between the first connection node and the second connection node and a control port connected to the first connection node; a second pull-down transistor having a current route formed between the second connection node and the second connection node and a control port connected to the first connection node having current restricting resistance; and loading unit formed between the reference voltage output node and the second power supply port.

BRIEF DESCRIPTION OF THE DRAWINGS

A more complete appreciation of this invention, and many of the attendant advantages thereof, will be readily apparent as the same becomes better understood by reference to the following detail description when considered in conjunction with the accompanying drawings, in which like reference symbols indicate the same or similar elements components, wherein.

DETAILED DESCRIPTION OF PREFERRED EMBODIMENTS OF THE INVENTION

Figure 1:
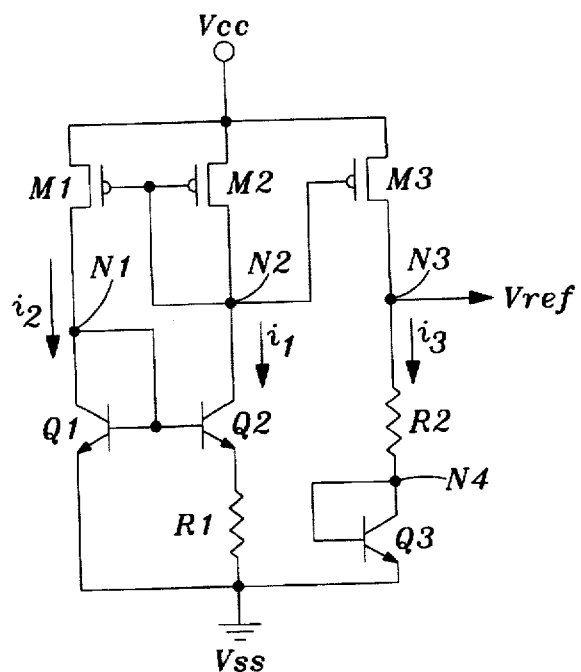
FIG. 1 is a circuit diagram illustrating the configuration of a conventional reference voltage generator.
Figure 2:
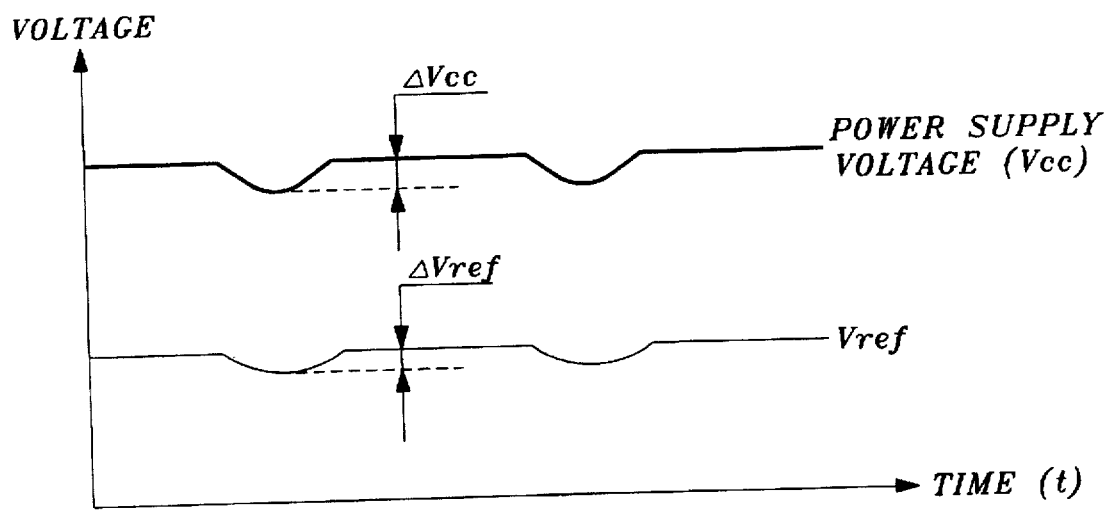
FIG. 2 illustrates the wave forms of input and output voltages for the operation of the conventional reference voltage generator shown in FIG. 1.

In the attached drawings, the same reference numerals will be used for the elements having essentially the same structure and function.

Figure 3:
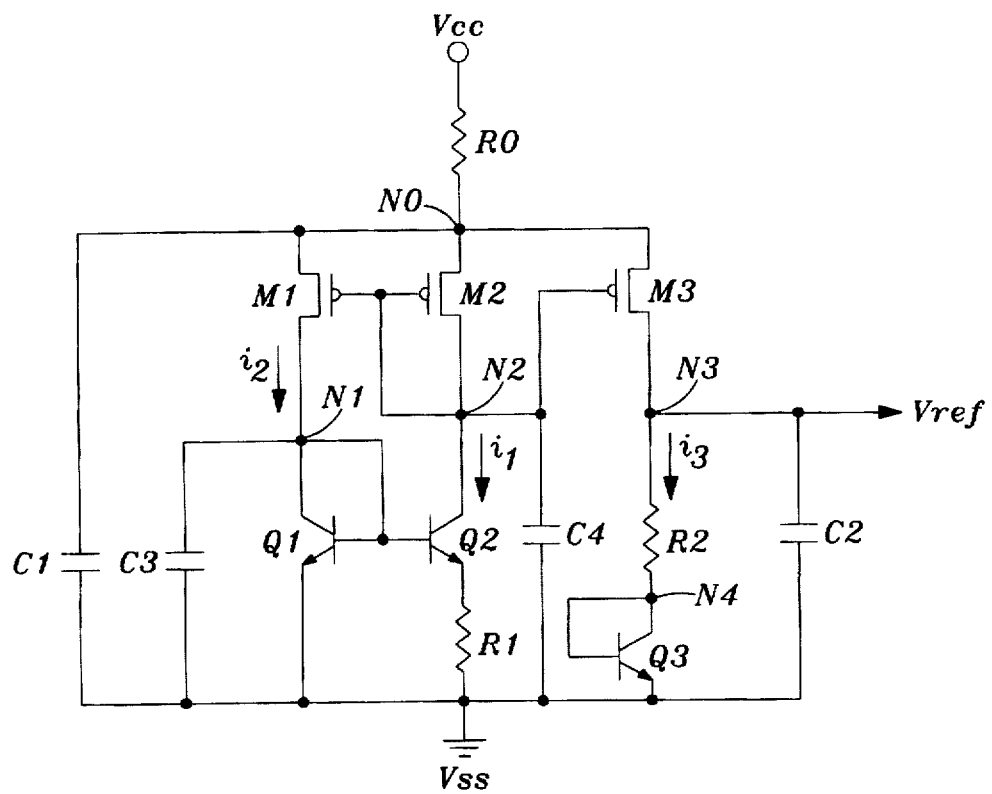
FIG. 3 is a circuit diagram illustrating the configuration of a reference voltage generator made of BiMOS transistors according to a first preferred embodiment of the present invention.

FIG. 3 shows the configuration of a reference voltage generator made of BiMOS transistors according to a first preferred embodiment of the present invention. The structure of the generator effectively restricts the fluctuation of the reference voltage resulting from high-frequency voltage fluctuations occurring at the power supply voltage $V_{cc}$. The circuit comprises a plurality of PMOS transistors $M_1$, $M_2$, and $M_3$, NPN-type bipolar transistors $Q_1$, $Q_2$ and $Q_3$ and resistors $R_1$ and $R_2$ as shown in FIG. 3. The desired output of the reference voltage $V_{ref}$ in this circuit is the same as defined in the expression (1) for the conventional reference voltage generator shown in FIG. 1. However, the reference voltage generator of the present invention, as described below with regard to the first preferred embodiment restricts the high-frequency fluctuation at a power supply voltage port to which the $V_{cc}$ is applied.

In the reference voltage generator shown in FIG. 3, a low pass filter is connected between the first and second power supply voltages, e.g., a power supply voltage $V_{cc}$ and a ground potential $V_{ss}$. This low pass filter removes the high-frequency component from the input voltage signal. The output of the low pass filter is connected to an inner power node $N_0$ to which the sources of the three PMOS transistors $M_1$, $M_2$, and $M_3$ are commonly connected. Second through fourth capacitors $C_2$, $C_3$, and $C_4$ are further connected between the ground potential $V_{ss}$ and each of the first, second and third connection nodes $N_1$, $N_2$ and $N_3$, which are connected respectively to the drains of each of the three transistors $M_1$, $M_2$, and $M_3$. The low pass filter preferably comprises a resistor $R_0$ connected between $V_{cc}$ and the node $N_0$ and a first capacitor $C_1$ connected between the node $N_0$ and $V_{ss}$.

The low pass filter, comprising a resistor $R_0$ and a first capacitor $C_1$, restricts the transmission of the high-frequency voltage fluctuation occurring at the $V_{cc}$ to the node $N_0$ to avoid the direct coupling of the high-frequency voltage fluctuation of the $V_{cc}$ port inside the reference voltage generator as shown in FIG. 3. In other words, an operational voltage where the high-frequency signal component is removed by the low pass filtering of the input of the $V_{cc}$ is provided to the node $N_0$. The second through fourth capacitors $C_2$, $C_3$, and $C_4$, which are connected between each connection node $N_1$, $N_2$, and $N_3$ and $V_{ss}$, act to restrict voltage fluctuation which is to be coupled to the inner connection node via parasitic capacitance between the gate-drain and the source-drain of the PMOS transistors $M_1$, $M_2$ and $M_3$ at the node $N_0$. In the first embodiment of the present invention, the transmission of the power supply voltage fluctuation caused by the operation of a chip to circuits formed on the chip is restricted by effectively restricting the high-frequency voltage fluctuation over about 1 MHz at $V_{cc}$. This is preferably accomplished by having the resistor $R_0$ be about 10 Kohms and the first capacitor $C_1$ be about 100 pF. Having the second through fourth capacitors $C_2$, $C_3$, and $C_4$ be about 10 pF enables the further restriction of the voltage fluctuation to a value small enough to be considered negligible, as shown in FIG. 4.

Figure 4:
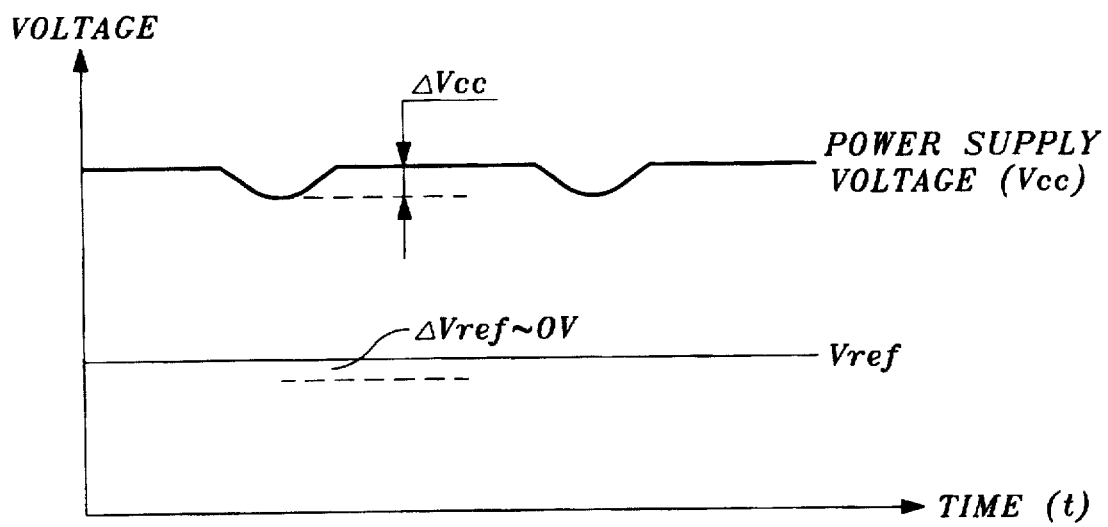
FIG. 4 illustrates the wave forms of input and output voltages for the operation of FIG. 2.

FIG. 4 shows a form of the input and output voltages for explaining the operation of the circuit shown in FIG. 3. As shown in FIG. 4, when the power supply voltage is input, having a high-frequency component and an amplitude of $V_{cc}$, the high-frequency component of the signal $V_{cc}$ is filtered by the resistor $R_0$ and the first capacitor $C_1$ and is then provided to the $N_0$. Thus, in the reference voltage generator structured as in FIG. 3 receives the power supply voltage $V_{cc}$ with its high-frequency signal component removed by means of the low pass filter. This circuit can thus generate the reference voltage $V_{ref}$ as described in the expression (1) and can output the voltage $V_{ref}$ to the third connection node $N_3$. The second to fourth capacitors $C_2$, $C_3$, and $C_4$, connected between the nodes $N_1$, $N_2$, and $N_3$ and $V_{ss}$, bypass toward $V_{ss}$ the high frequency signal component occurring at each drain due to the high-frequency fluctuation of the $V_{cc}$ by the parasitic capacitance between the source-drain and the source-gate of the transistors $M_1$, $M_2$, and $M_3$. Accordingly, the level of $V_{ref}$ output to the output port is not affected by the high-frequency voltage fluctuation at the $V_{cc}$ port as shown in FIG. 4. $V_{ref}$ is output to the output port by the operation of the pull-up PMOS transistors $M_1$, $M_2$, and $M_3$ and the pull-down bipolar transistors $Q_1$, $Q_2$ and $Q_3$.

In the embodiment shown in FIG. 3, the high-frequency voltage fluctuation from the power supply voltage port to which the $V_{cc}$ is provided can reduce the high-frequency effect to the circuit when the values of the resistor $R_0$ and the first capacitor $C_1$ are large. However, when overly large resistance value is used, the voltage drop at the resistor $R_0$ increases, thus reducing the range of stable operation for the circuit. In the first preferred embodiment of the present invention, since the average current is 10 μA and the value of the resistor $R_0$ is about 10 kΩ, the average voltage drop at the $R_0$ is set to be about 0.1 V. At this stage, the values of the resistor $R_0$ and the first capacitor $C_1$ can be adjusted appropriately according to a degree of the high-frequency voltage fluctuation required in the reference voltage generator. Although used in the first preferred embodiment, the second through fourth capacitors $C_2$, $C_3$, and $C_4$ in the reference voltage generator, may be omitted in alternate embodiments.

When at least two of the reference voltage generator shown in FIG. 3 are formed on a single chip, the high-frequency voltage fluctuation can be efficiently reduced by connecting the common source nodes of all the PMOS transistors in each of the reference voltage generator and connecting one resistor between the common source node and the power supply voltage, while connecting a capacitive device between the common source node and the ground power. Since current consumption increases in such a case as opposed to the case of using only a single reference voltage generator, the voltage drop increases at the resistor $R_0$. Thus, by using a low resistance for the resistor $R_0$ and a high capacitance for the first capacitor $C_1$, the characteristic problem of the voltage drop across the resistor $R_0$ can be significantly reduced.

Thus, in the reference voltage generator structured as in FIG. 3, the high-frequency signal loaded in $V_{cc}$ is removed by filtering the input voltage provided from the outside using the resistor $R_0$ and first capacitor $C_1$. This filtering restricts the high-frequency fluctuation of $V_{ref}$ thus stabilizing the level of the operational power supply voltage in the chip.

Figure 5:
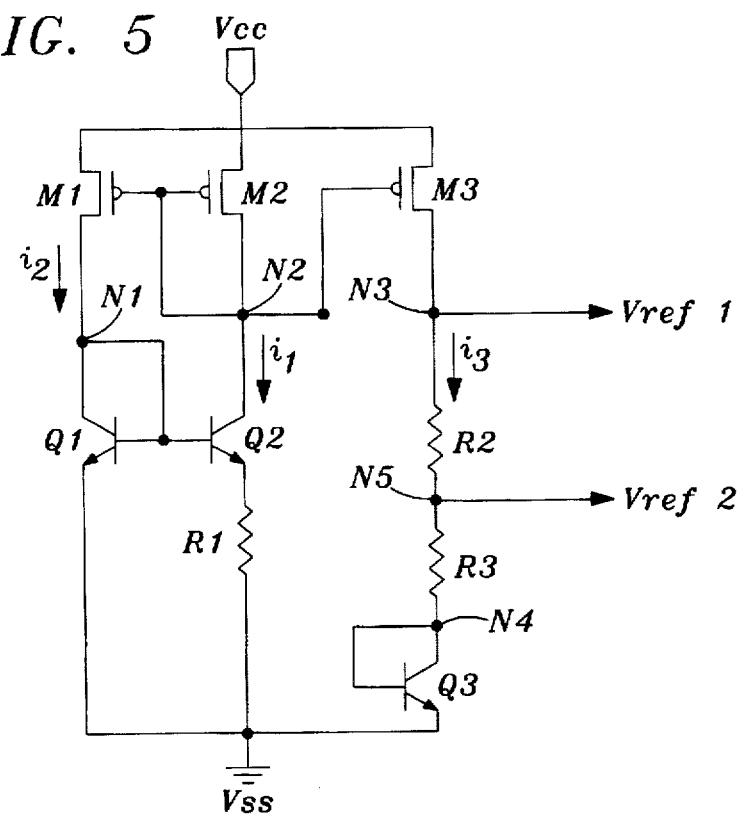
FIG. 5 is a circuit diagram illustrating the configuration of a reference voltage generator for outputting first and second reference voltages having different output levels according to a second preferred embodiment of the present invention.

FIG. 5 shows a reference voltage generator according to a second preferred embodiment of the present invention, in which the basic structure is similar to the circuits shown in FIGS. 1 and 3. The difference from the structure of FIG. 1 is the inclusion of a third pull-down resistor, i.e., there are two pull-down resistors $R_2$ and $R_3$ connected between the nodes $N_3$ and the $N_4$. This allows the circuit to generate two reference voltages having different level, two reference voltages $V_{ref1}$ and $V_{ref2}$ at nodes $N_3$ and $N_5$, respectively. As with the circuit of FIG. 3, the base and collector of the bipolar transistor $Q_3$ are connected in common to the node $N_4$. In the second preferred embodiment, the emitter of the bipoalr transistor $Q_3$ is connected to the third pull-down transistor $R_3$, rather than the second pull-down bipolar transistor $Q_2$. The levels of the $V_{ref1}$ and $V_{ref2}$ generated from the nodes $N_3$ and $N_5$, respectively, are output according to the following expressions (2) and (3).

$$V_{ref1}=V_{be}+(V_t)((R_2+R_3)/R_1)(i_3/i_1)ln[(i_2/i_1)(i_{o(Q2)}/i_{o(Q1)})] \quad (2)$$

$$V_{ref2}=V_{be}+(V_t)(R_3/R_1)(i_3/i_1)ln[(i_2/i_1)(i_{o(Q2)}/i_{o(Q1)})] \quad (3)$$

Though it is not described in detail with regard to FIG. 5, the method for restricting the characteristic lowering of the reference voltages due to the high-frequency voltage fluctuation at the $V_{cc}$ port is similar to that applied to the circuit of FIG. 3. The reduction of the high-frequency voltage fluctuation at the common source port of the PMOS transistors is achieved by connecting the resistor $R_0$ between $V_{cc}$ and the common source port of the transistors $M_1$, $M_2$, and $M_3$ as shown in FIG. 5, and by connecting the first capacitor $C_1$ between the common source port and $V_{ss}$. In this way, the circuit can stably maintain the output of the reference voltage of each of $V_{ref1}$ and $V_{ref2}$. In alternate embodiments, the above stable output can be achieved by selectively connecting a capacitor between $V_{ss}$ and any or all of the nodes $N_1$, $N_2$, $N_3$, $N_4$, and $N_5$.

In the reference voltage generator according to the second embodiment of the present invention as shown in FIG. 5, it is possible to generate a plurality of reference voltages having different voltage levels by separating a load resistance device connected to the output port into a plurality of serial resistors, to thereby efficiently generate a plurality of reference voltages without increasing the current consumption. In the circuit shown in FIG. 5, the reference voltages $V_{ref1}$ and $V_{ref2}$, each having a different voltage level, are generated by the voltage drop difference of the serial-connected resistors $R_2$ and $R_3$. In this way, a plurality of reference voltage outputs are provided without a significant increase of the required chip area.

Figure 6:
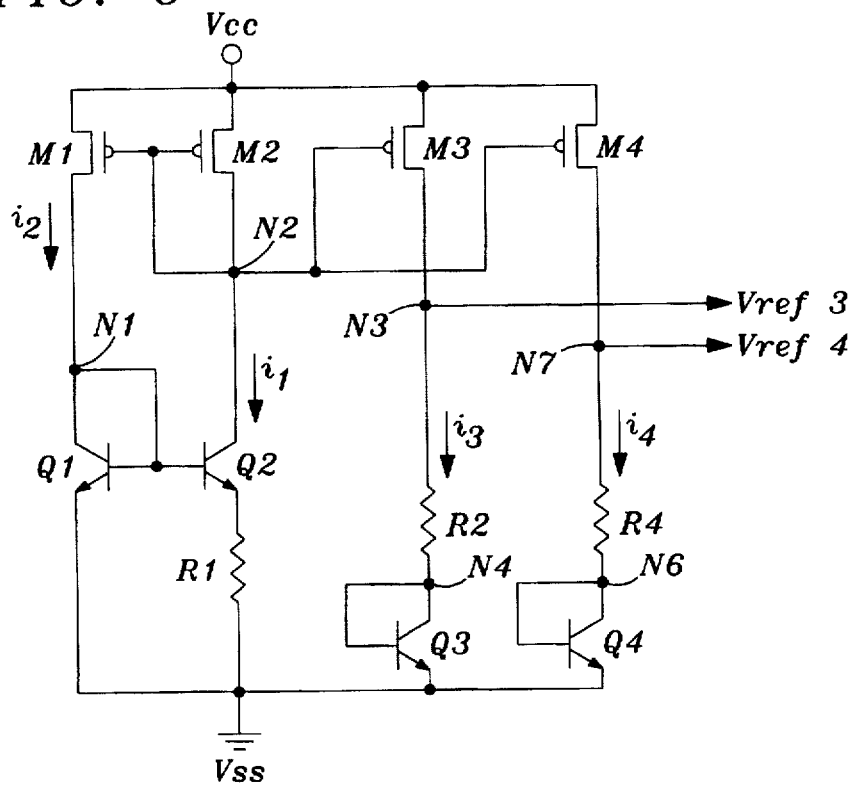
FIG. 6 is a circuit diagram illustrating the configuration of a reference voltage generator for outputting two reference voltages having different output levels according to a third preferred embodiment of the present invention.

FIG. 6 shows a reference voltage generator according to a third preferred embodiment of the present invention. In the circuit shown in FIG. 6, two reference voltages having different output levels from each other are generated. A second reference voltage output means is further provided to the configuration shown in FIG. 1. In this circuit, the channel of the source-drain of a PMOS transistor $M_4$ and the collector-emitter of a NPN bipolar transistor $Q_4$ are connected in series between a node to which the $V_{cc}$ is input and the $V_{ss}$. The collector and the base of the bipolar transistor $Q_4$ are connected in common to a load resistor $R_4$; and the gate of the PMOS transistor $M_4$ is connected to the node $N_2$ which is connected in common to the gates of the PMOS transistors $M_1$, $M_2$, and $M_5$. In the circuit shown in FIG. 6, the generation of the $V_{ref3}$ is accomplished in the same way as the generation of $V_{ref}$ in FIG. 1. The additional reference voltage $V_{ref4}$ is generated by the resistor $R_4$ and the bipolar transistor $Q_4$ in a manner similar to the generation of $V_{ref3}$. $V_{ref3}$ and $V_{ref4}$ are each output according to the following expressions (4) and (5).

$$V_{ref3}=V_{be3}+(V_t)(R_2/R_1)(i_3/i_1)ln[(i_2/i_1)(i_{o(Q2)}/i_{o(Q1)})] \quad (4)$$

$$V_{ref4}=V_{be4}+(V_t)(R_4/R_1)(i_4/i_1)ln[(i_2/i_1)(i_{o(Q2)}/i_{o(Q1)})] \quad (5)$$

In the expressions (4) and (5), $V_{be3}$ and $V_{be4}$ are the voltage levels at the connection nodes $N_4$ and $N_6$, respectively, which are voltages between the base-emitter of the bipolar transistors $Q_3$ and $Q_4$. "$I_3/i_1$" is a constant determined by the ratio of the channel width with respect to the channel length (W/L) of the PMOS transistors $M_3$ and $M_2$, as described above, and "$i_4/i_1$" is a constant determined by the ratio of the W/L value of the PMOS transistors $M_4$ and $M_2$.

When a plurality of reference voltages of different output levels are necessary, the structure of the circuit shown in FIG. 6 can avoid duplication of the circuit comprising the pull-up PMOS transistors $M_1$ and $M_2$, the resistor $R_1$ for adjusting output level, and the pull-down bipolar transistor $Q_1$ and $Q_2$. Though not shown in the of FIG. 6, it should be noted that the restriction of the characteristic lowering due to the high-frequency voltage fluctuation at the $V_{cc}$ port may be made possible by placing a resistor between the $V_{cc}$ port and the common source port of the PMOS transistors $M_1$, $M_2$, and $M_3$; a capacitor between the common source port and the ground power supply; and a capacitor selectively connected between the inner connection node and the ground power supply, as described with reference to FIG. 3.

Figure 7:
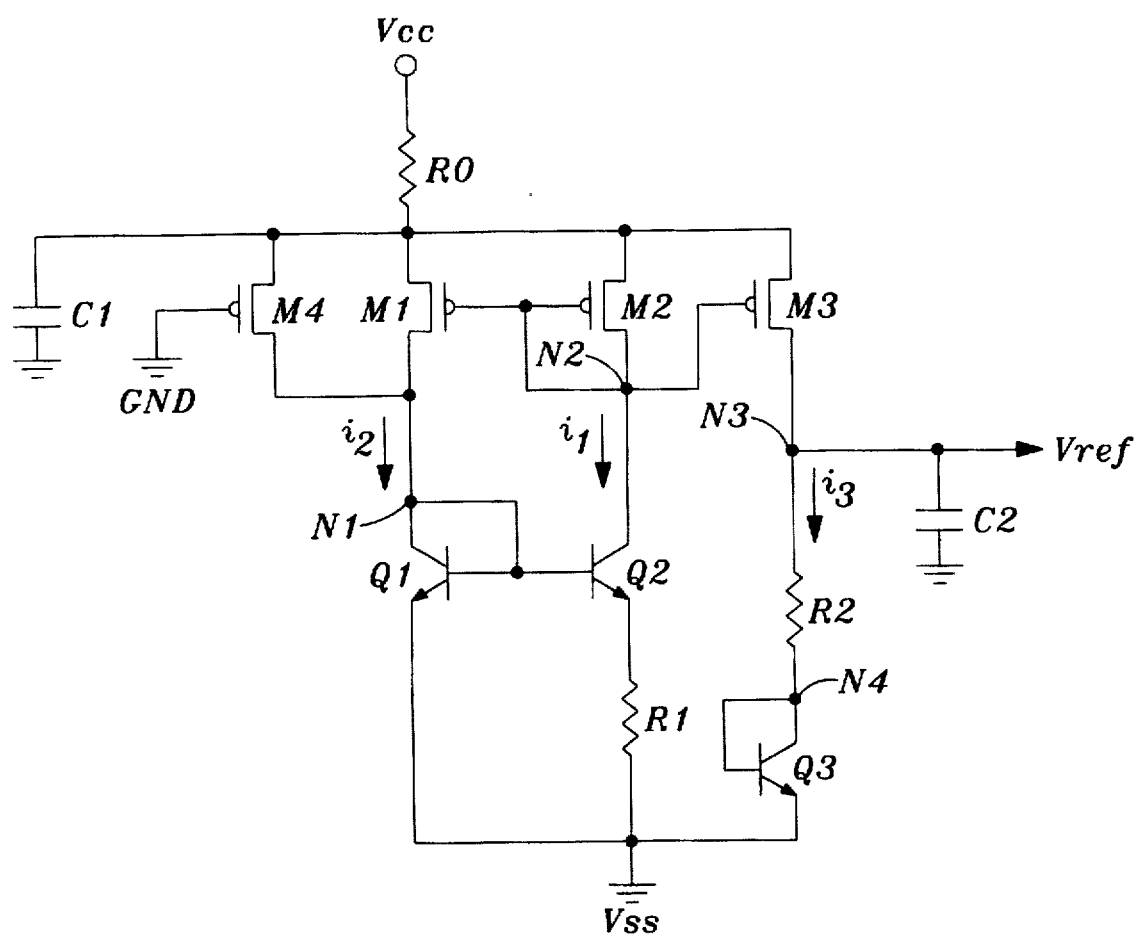
FIG. 7 is a circuit diagram illustrating the configuration of a reference voltage generator according to a fourth preferred embodiment of the present invention.

FIG. 7 shows the configuration of the reference voltage generator according to a fourth preferred embodiment of the present invention. The difference between the structure shown in FIG. 3 and that shown in FIG. 7 is that the capacitors $C_3$ and $C_4$ connected between $V_{ss}$ and the nodes $N_1$ and $N_2$ are removed, the channel of the source-drain of the starting PMOS transistor $M_4$ is serially connected to the channel of the source-drain of the PMOS transistor $M_1$, and the gate of the starting PMOS transistor $M_4$, which is a control electrode, is connected to $V_{ss}$. The starting PMOS transistor $M_4$ prevents the pull-down bipolar transistor $Q_1$ from not being "turned on" by the voltage of the node $N_1$ when $V_{cc}$ is supplied to it. The operation of the circuit shown in FIG. 7 is described as follows.

When $V_{cc}$ is supplied to the circuit shown in FIG. 7, the starting PMOS transistor $M_4$ is in the "on" state. Since the gate of the PMOS transistor $M_4$ is connected to $V_{ss}$, it will remain "on" at all times. The circuit thus operates in a normal state by providing a collector-base current to the bipolar transistor $Q_1$ from $V_{cc}$ via the PMOS transistor $M_4$.

When the current provided through the channel between the source-drain of the PMOS transistor $M_4$ becomes considerably large with respect to the current in the PMOS transistor $M_1$, the output level of the $V_{ref}$ changes due to the fluctuation of the value of the resistor ratio "$R_2/R_1$." Thus, the current supplied via the PMOS transistor $M_4$ should be minimized by making the W/L of the PMOS transistor $M_4$ equal to or less than about 1/100 with respect to the PMOS transistors $M_1$, $M_2$, and $M_3$. The present invention minimizes the reference voltage fluctuation due to the PMOS transistor $M_4$ by setting the W/L of the PMOS transistors $M_1$ and $M_4$ to be 30 μm/50 μm and 1 μm/50 μm, respectively.

In FIG. 7, the starting PMOS transistor $M_4$ is turned on concurrently with the input of $V_{cc}$. This transistor is connected in parallel to the channel of the pull-up PMOS transistor $M_1$ to make more accurate the driving of the pull-down bipolar transistor $Q_1$. This solves the problem of the initial malfunction of the reference voltage generating circuit and allows for a more reliable reference voltage generator.

Figure 8:
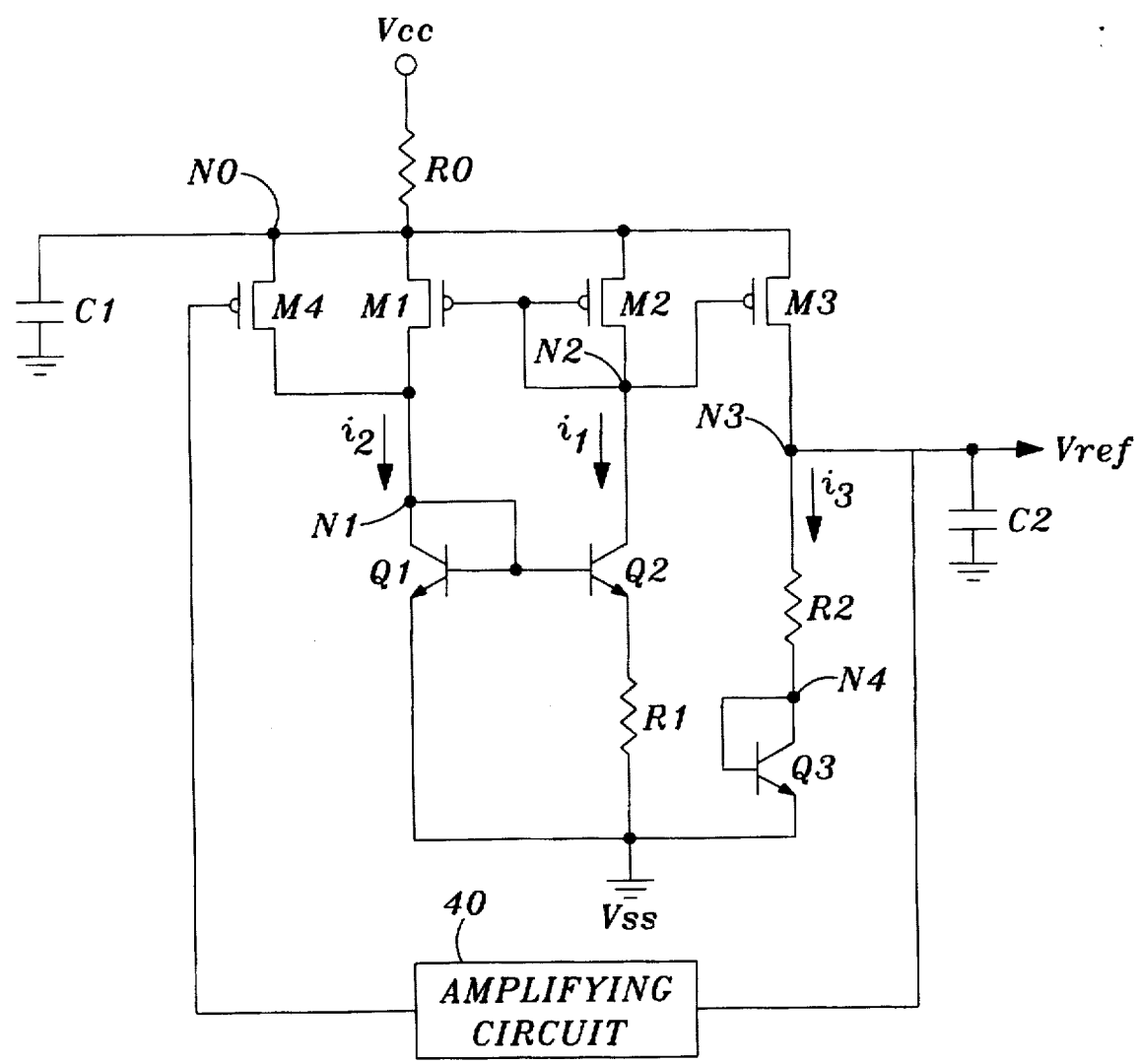
FIG. 8 is a circuit diagram illustrating the configuration of a reference voltage generator according to a fifth preferred embodiment of the present invention.

FIG. 8 shows a reference voltage generator according to a fifth preferred embodiment of the present invention. It is the characteristic of this preferred embodiment that the data of the starting PMOS transistor $M_4$ is driven by the amplification of the fluctuation range of $V_{ref}$. In other words, the PMOS transistor $M_4$ is driven by the output of an amplifying circuit 40, which receives its input from $V_{ref}$. This has the effect of completely removing any operation lowering which may occur due to the PMOS transistor $M_4$. The characteristic point of the reference voltage generator having the structure as shown in FIG. 8 is that the gate of the starting PMOS transistor $M_4$ is controlled by amplifying the change of the output level of the $V_{ref}$ of which operation will be described in the following.

When the $V_{ref}$ maintains a ground potential GND level at the initial application of the $V_{cc}$, the input of the amplifying circuit 40 maintains a "low" level. At this time, the output of the circuit 40 has a value of $V_{ss}$. (The detailed description of the amplifying circuit 40 will be supported by the preferred embodiment of the amplifying circuit.). Since the gate of the PMOS transistor $M_4$ is $V_{ss}$, the PMOS transistor $M_4$ is set "on" in this initial state. Accordingly, current is supplied to the collector of the $Q_1$, and as a result, the reference voltage generator is driven. Thus, the current supplied via the PMOS transistor $M_4$ turns "on" the bipolar transistors $Q_1$ and $Q_2$ and the PMOS transistor $M_2$. The reference voltage generator then operates normally and the amplifying circuit 40 receives the rising $V_{ref}$ amplifies it, and provides the amplified voltage to the gate of the PMOS transistor $M_4$. When $V_{ref}$ rises over about 1.0 V, the amplified voltage output by the amplifying circuit 40 is sufficient to turn "off" the PMOS transistor $M_4$. Following this, the circuit operates substantially like the reference voltage generator described above with reference to FIG. 3. Thus, in the structure of FIG. 8, the current supplied via the PMOS transistor $M_4$ is removed, thus reducing the operation current of the circuit.

Figure 9:
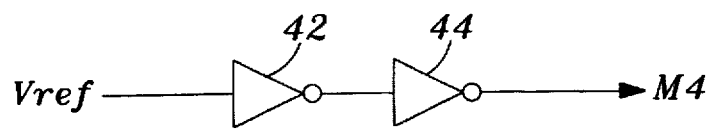
FIGS. 9 and 10 are circuit diagrams showing prefered embodiments of detailed circuit of the amplifying circuit shown in FIG. 8.

FIG. 9 shows a first preferred embodiment of the amplifying circuit 40 of FIG. 8. In the structure of FIG. 8, the amplifying circuit comprises two serially connected CMOS inverters 42 and 44. Since $V_{ref}$ is applied only to the gate of MOS transistors, there is no serial current consumption of $V_{ref}$ and the level of $V_{ref}$ is maintained. Thus, the inclusion of the amplifying circuit 40 does not increase the operational current consumption of the reference voltage generator without the amplifying circuit 40.

Figure 10:
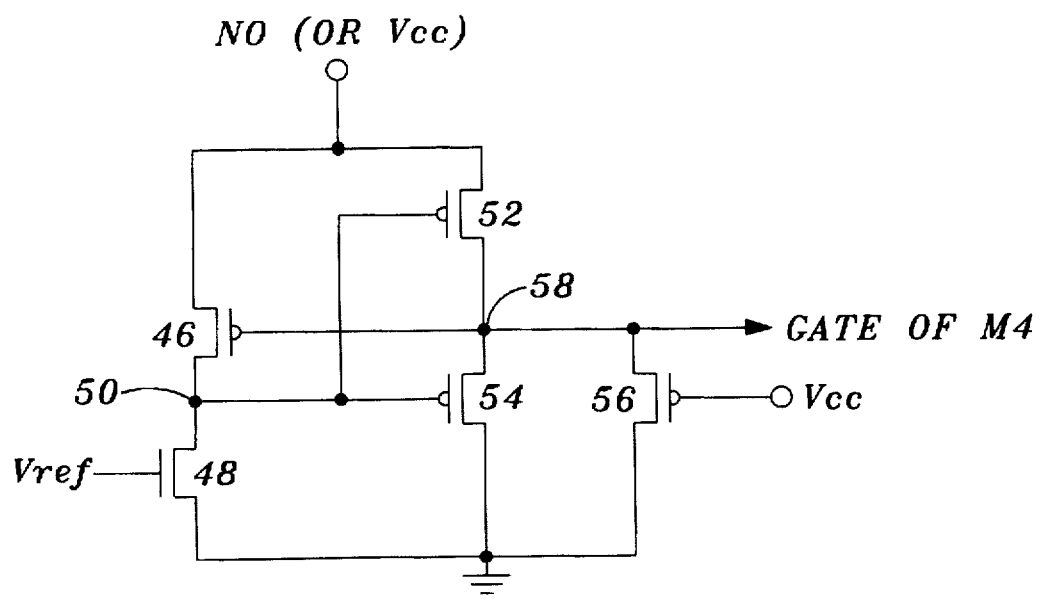

FIG. 10 shows a second preferred embodiment of the amplifying circuit 40 of FIG. 8. The amplifying circuit 40 comprises a pull-up PMOS transistor 46, a pull-down NMOS transistor 48, a pull-up PMOS transistor 52, a pull-down NMOS transistor 54, and a pull-down NMOS transistor 56. The pull-up PMOS transistor 46 has its channel formed between $V_{cc}$ and a connection node 50 and has its gate connected to an output node 58. The pull-down NMOS transistor 48 has its channel formed between the connection node 50 and $V_{ss}$ and has its gate connected to $V_{ref}$. The pull-down PMOS transistor 52 has its channel formed between $V_{cc}$ and the output node 58 and has its gate connected to the connection node 50. The pull-down NMOS transistor 54 has its channel formed between the output node 58 and the ground potential $V_{ss}$ and has its gate connected to the connection node 50. The pull-down NMOS transistor 56 has its channel formed between the output node 58 and the ground potential $V_{ss}$ and has its gate connected to $V_{cc}$.

In the above structure, the PMOS transistors 46 and 52 and the NMOS transistors 48 and 54 together comprise a latch circuit. When $V_{cc}$ is applied, the NMOS transistor 56 is turned "on" and the output of its drain node is initialized at $V_{ss}$. The initialized output of the drain node is then provided to the gate of the starting PMOS transistor $M_4$ shown in FIG. 8 to turn "on" the PMOS transistor $M_4$. As noted above, when the PMOS transistor $M_4$ is turned "on," the reference voltage generator shown in FIG. 8 starts to operate.

When the level of $V_{ref}$ input to the NMOS transistor 48 is about $V_{ss}$, the level of the node 58 becomes about $V_{ss}$ when $V_{cc}$ is input to the amplifying circuit 40. At this time, the PMOS transistor 46 is turned "on" and increases the gate voltage of the PMOS transistor 52 and NMOS transistor 54 up to that of $V_{cc}$. As this voltage is increased up to $V_{cc}$, the PMOS transistor 52 is turned "off" and the NMOS transistor 54 is turned "on," which definitely maintains the output as the level at $V_{ss}$.

However, when the input reference voltage $V_{ref}$ rises over a threshold voltage of the NMOS transistor 48 (preferably about 1.0 V), the current driving capacity of the NMOS transistor 48 improves. Accordingly, the voltage at the drain connection node 50 of the NMOS transistor 48 drops to the level of $V_{ss}$. This converts the output of the output node 58 to a "high" state, and makes the PMOS transistor 46 non-conductive. Thus, the input of $V_{ref}$ at about 1.0 V and the output of $V_{cc}$ are maintained. At this stage, since the PMOS transistor 52 and the NMOS transistor 56 are concurrently made to be conductive, the W/L ratio of the MOS transistor should be adjusted properly such that the current driving capacity of the NMOS transistor 56 is much less than the that of the PMOS transistor 52. Preferably the W/L ratio of the NMOS transistor 56 should be about 1/20~1/50 that of PMOS transistor 52.

Figure 11:
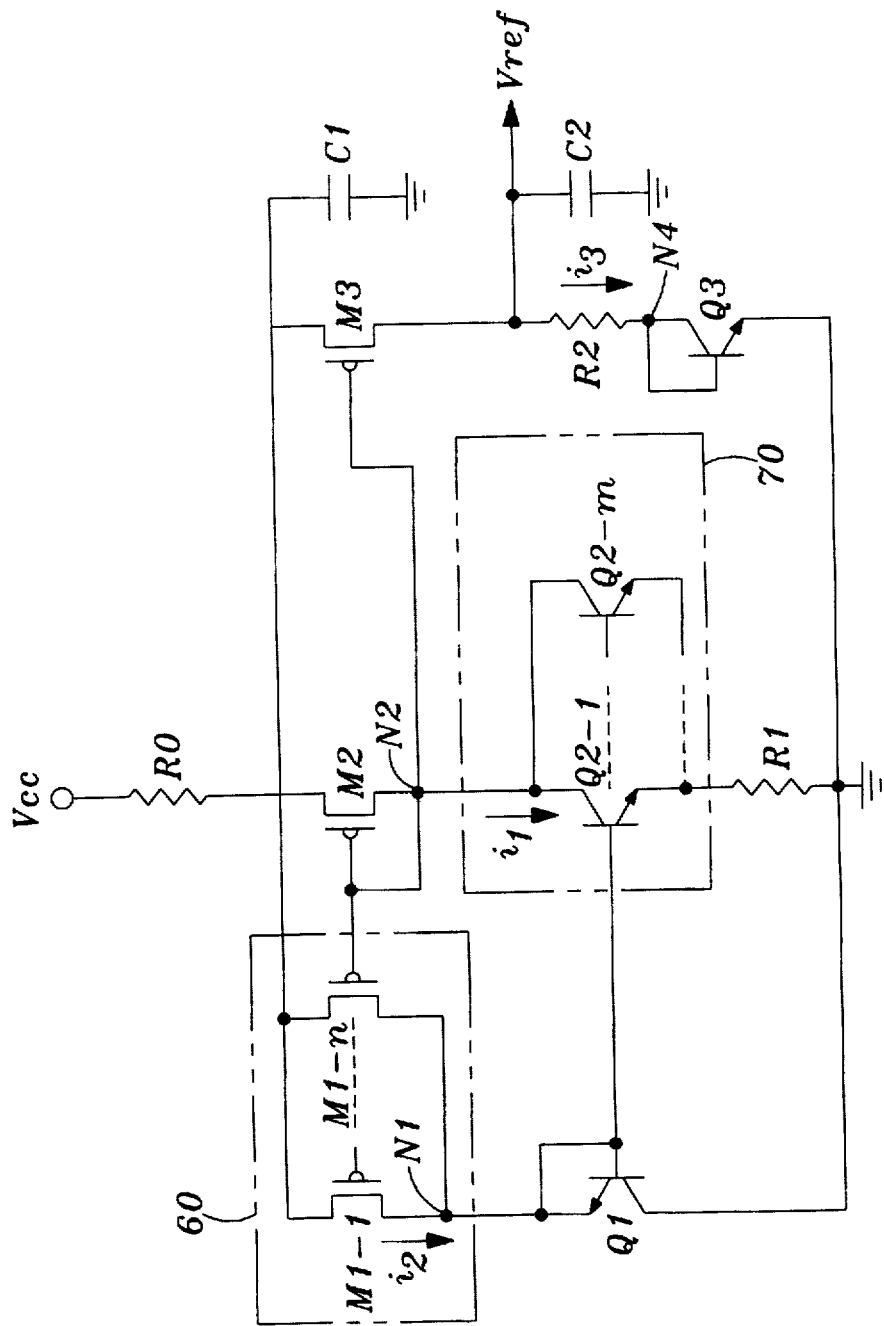
FIG. 11 is a circuit diagram illustrating the configuration of a reference voltage generator according to a sixth preferred embodiment of the present invention.

FIG. 11 shows a reference voltage generator according to a sixth embodiment of the present invention. As compared with the structure shown in FIG. 3, the capacitors $C_3$ and $C_4$ are removed and the PMOS transistor $M_1$ and bipolar transistor $Q_2$ are substituted with a plurality of PMOS transistors $M_{1-1}, \ldots, M_{-n}$ and a plurality of bipolar transistors $Q_{2-1}, \ldots, Q_{2-m}$.

The current driving capacity of the pull-up PMOS transistor $M_1$ is improved to three times than that of the pull-up PMOS transistor $M_2$ in the current driving capacity of the PMOS transistors $M_1$ and $M_2$ shown in FIG. 3. The parallel connection of the three PMOS transistors for use as shown by a dotted block 60 can thus provide more accurate current driving capacity than the case of simply changing the channel width three times. In this circuit, the PMOS transistors $M_{1-1}, M_{1-2}, \ldots, M_{1-n}$ may not be transistors having the same size.

As with using a pull-up PMOS transistor to improve the current driving capacity of a pull-down bipolar transistor, a bipolar transistor can be replaced by a plurality of bipolar transistors connected in parallel bipolar transistors according to the same principle. In this case, the current driving capacity can be improved over neighboring pull-down bipolar transistors by having a bipolar transistor $Q_2$ similar to that shown in FIG. 3 be replaced by a plurality of bipolar transistors $Q_{2-1}, Q_{2-1}, \ldots Q_{2-m}$ connected in parallel as shown in a dotted block 70 in FIG. 11.

As described above, each of the preferred embodiments of reference voltage generators using various structures made of BiMOS transistors restricts the fluctuation of the output voltage of the reference voltage due to the high-frequency fluctuation at the power supply voltage port. This helps to stably maintain the generation of the reference voltage, to reduce the current consumption, and to overcome the difficulties in the lowering of the operation voltage of the circuit and allow for the use of a low power supply voltage. In these circuits, even when the initial setting is inappropriately done, the circuit can always operate normally during the supply of the power supply voltage.

The present invention is not limited to the above-described embodiments. Various changes and modifications may be effected by one having an ordinary skill in the art and remain within the scope of the invention, as defined by the appended claims.

What is claimed is:

1. A reference voltage generator in a semiconductor device comprising:

first and second power ports to which first and second power supplies are independently provided;

a filter connected between the first and second power ports for filtering the first power supply from the first power port and providing the filtered power supply to an inner power supply node;

a first pull-up transistor having a current route formed between the inner power supply node and a first connection node, and a control port connected to a second connection node;

a second pull-up transistor having a current route formed between the inner power supply node and the second connection node, and a control port connected to the second connection node;

a third pull-up transistor having a current route formed between the inner power supply node and a reference voltage output node, and a control port connected to the second connection node;

a first pull-down transistor having a current route formed between the first connection node and the second power port, and a control port connected to the first connection node;

a second pull-down transistor having a current route formed between the second connection node and the second power port, and a control port connected to the first connection node having current restricting resistance; and loading means formed between the reference voltage output node and the second power supply port.

2. A reference voltage generator as recited in claim 1, wherein the filter comprises a resistor connected between the first power supply port and the inner power supply node and a first capacitor connected between the inner power supply node and the second power supply port, the filter acting as a low pass filter, filtering a signal component due to high-frequency fluctuation in the first power supply port.

3. A reference voltage generator as recited in claim 2, further comprising a second capacitor provided between the reference voltage output node and the second power supply port for passing a high-frequency signal component to the second power supply port.

4. A reference voltage generator as recited in claim 2, wherein the first power supply is a power supply voltage and the second power supply is a ground potential.

5. A reference voltage generator as recited in claim 2, wherein each of the first, second, and third pull-up transistors comprise insulating gate field effect transistors having a P-type channel.

6. A reference voltage generator as recited in claim 2, wherein the first and second pull-down transistors are NPN type bipolar transistors.

7. A reference voltage generator as recited in claims 1, further comprising a fourth pull-up transistor having a current route formed between the first power supply node and the first connection node, and a control port connected to the second power supply, the fourth pull-up transistor always maintaining a conductive state.

8. A reference voltage generator as recited in claim 1, wherein the loading means comprises a load resistance formed between the reference voltage output node and a predetermined third connection node and an NPN type bipolar transistor having a current route formed between the load resistance and the second power supply port, and a control port connected to the third connection node.

9. A reference voltage generator as recited in claim 1, further comprising at least one additional pull-up transistor having a current route formed between the first power supply port and the first connection node, and a control port connected to the second connection node so as to perform the same switching action as the first pull-up transistor.

10. A reference voltage generator as recited in claim 1, further comprising at least one additional pull-down transistor having a current route formed between the second connection node and the resistance means and a control port connected to the first connection node so as to perform the same switching action as the second pull-down transistor.

11. A reference voltage generator as recited in claim 1, further comprising a third capacitor between the first connection node and the second power supply port.

12. A reference voltage generator as recited in claim 1, further a fourth capacitive device between the second connection node and the second power supply port.

13. A reference voltage generator formed between first and second power supply ports to which first and second power supplies are provided, the generator comprising:

a first resistor connected between the first power supply port and an inner power supply node;

a first capacitor connected between the inner power supply node and the second power supply port;

a first pull-up transistor having a current route formed between the inner power supply node and a first connection node, and a control node connected to a predetermined second connection node;

a second pull-up transistor having a current route formed between the inner power supply node and a reference voltage output node, and a control node connected to the second connection node;

a third pull-up transistor having a current route formed between the inner power supply node and the reference voltage node, and a control node connected to the second connection node;

a fourth pull-up transistor connected in parallel with the first pull-up transistor and operated in response to a starting signal input to the control port;

a first pull-down transistor having a current route formed between the first connection node and the second power supply port, and a control node connected to the first connection node;

a second pull-down transistor having a current route formed between the second connection node and the second power supply port, and a control node connected to the first connection node;

loading means formed between the reference voltage output node and the second power supply port; and an amplifying circuit formed between the reference voltage output node and a control port of the fourth pull-up transistor for driving the fourth pull-up transistor according to the voltage output of the reference voltage output node.

14. A reference voltage generator as recited in claim 13, further comprising a second capacitor between the reference voltage output node and the second power supply port.

15. A reference voltage generator as recited in claim 13, wherein the first and second power supplies are power supply voltage and ground power supply, respectively.

16. A reference voltage generator as recited in claim 15, each of the first, second, third, and fourth pull-down transistors comprises an insulating gate field effect transistor having a P-type channel.

17. A reference voltage generator as recited in claim 16, wherein each of the first and second pull-down transistors comprises an NPN type bipolar transistor.

18. A reference voltage generator as recited in claim 15, wherein the loading means comprises a resistor formed between the reference voltage output node and a predetermined third connection node, and an NPN type bipolar transistor having a current route formed between the resistance and the second power supply port and a control port connected to the third connection node.

19. The reference voltage generator in a semiconductor device as claimed in claim 15, wherein the amplifying circuit comprises two serially-connected CMOS inverters of which an input port is connected to the reference voltage output node.

20. A reference voltage generator as recited in claim 15, wherein the amplifying circuit comprises a latch circuit formed between the reference voltage output node and the control port of the fourth pull-up transistor, and an initializing transistor formed between the output port of the latch circuit and the second power supply port, the latch circuit always maintaining a conductive state.

21. A reference voltage generator as recited in claim 15, further comprising at least one pull-up transistor having a current route formed between the inner power supply node and the first connection node, and a control port connected to the second connection node so as to perform the same switching action as the first pull-up transistor.

22. A reference voltage generator as recited in claim 15, further comprising at least one pull-down transistor having a current route formed between the second connection node and the resistive means, and a control port connected to the first connection node so as to perform the same switching action as the second pull-down transistor.

23. A reference voltage generator comprising:

a first power supply port to which first power supply is provided;

a second power supply port to which second power supply is provided;

a first pull-up transistor having a current route formed between the first power supply port and a first connection node, and a control node connected to a predetermined inner second connection node;

a second pull-up transistor having a current route formed between the first power supply port and the second connection node, and a control node connected to the second connection node;

a third pull-up transistor having a current route formed between the first power supply port and the first reference voltage output node, and a control node connected to the second connection node;

a first pull-down transistor having a current route formed between the first connection node and the second power supply port, and a control node connected to the first connection node;

a second pull-down transistor having a current route formed between the second connection node and the second power supply port, and a control node connected to the first connection node;

a resistor connected between the first power supply output node and an inner second reference voltage output node; and an NPN type bipolar transistor having a current route formed between the fourth connection node and the second power supply voltage, and a control port connected to the fourth connection node.

24. A reference voltage generator as recited in claim 23, wherein the first and second power supplies are power supply voltage and ground power supply, respectively.

25. A reference voltage generator as recited in claim 23, wherein each of the first, second, and third pull-up transistors comprises an insulating gate field effect transistor having a P-type channel, and wherein each of the first and second pull-down transistor comprises an NPN type bipolar transistor.

26. A reference voltage generator comprising:

a first power supply port to which first power supply is provided;

a second power supply port to which second power supply is provided;

a first pull-up transistor having a current route formed between the first power supply port and a first connection node, and a control node connected to a second connection node;

a second pull-up transistor having a current route formed between the first power supply port and the second connection node, and a control node connected to the second connection node;

a third pull-up transistor having a current route formed between the first power supply port and a first reference voltage output node, and a control node connected to the second connection node;

a first pull-down transistor having a current route formed between the first connection node and the second power supply port, and a control node connected to the first connection node;

a second pull-down transistor having a current route formed between the second connection node and a third connection node, and a control node connected to the first connection node;

a first resistor connected between the third connection node and the second power supply port;

a second resistor connected between the first reference voltage output node and a second reference voltage output node;

a third resistor connected between the the second reference voltage output node and a fourth connection node; and an NPN type bipolar transistor having a current route formed between the fourth connection node and the second power supply voltage, and a control port connected to the fourth connection node.

27. A reference voltage generator as recited in claim 26, wherein each of the first, second, and third pull-up transistors comprises an insulating gate field effect transistor having a P-type channel, and wherein each of the first and second pull-down transistor comprises an NPN type bipolar transistor.

28. A reference voltage generator comprising:

a first power supply port to which first power supply is provided;

a second power supply port to which second power supply is provided;

a first pull-up transistor having a current route formed between the first power supply port and a first connection node, and a control node connected to a second connection node;

a second pull-up transistor having a current route formed between the first power supply port and the second connection node, and a control node connected to the second connection node;

two or more additional pull-up transistors having two or more respective current routes formed between the first power supply port and two or more reference voltage output nodes, and each control port being connected to the second connection node for controlling each of the current routes;

a first pull-down transistor having a current route formed between the first connection node and the second power supply port, and a control node connected to the first connection node;

a second pull-down transistor having a current route formed between the second connection node and a third connection node, and a control node connected to the first connection node;

a first resistor connected between the third connection node and the second power supply port;

two or more loading means formed between each of the reference voltage output nodes and the second power supply port, wherein two or more reference voltage outputs are provided at the two or more reference voltage output nodes.

29. A reference voltage generator as recited in claim 28, wherein each of the first and second and the two or more additional pull-up transistors comprise an insulating gate field effect transistor having a P-type channel.

30. A reference voltage generator as recited in claim 28, each of the first and second and the two or more additional pull-up transistors comprise insulating gate field effect transistors having a P-type channel.

31. A reference voltage generator comprising:

a first power supply port to which first power supply is provided;

a second power supply port to which second power supply is provided;

a first resistor formed between the first power supply port and an inner power supply node;

a first capacitor formed between the inner power supply node and the second power supply port;

a first pull-up transistor having a current route formed between the inner power supply node and a first connection node, and a control node connected to a second connection node;

a second pull-up transistor having a current route formed between the inner power supply node and the second connection node, and a control node connected to the second connection node;

two or more additional pull-up transistors having two or more current routes formed between the inner power supply node and two or more reference voltage output nodes, and each control port being connected to the second connection node for controlling each of the current routes;

a first pull-down transistor having a current route formed between the first connection node and the second power supply port, and a control node connected to the first connection node;

a second pull-down transistor having a current route formed between the second connection node and a third connection node, and a control node connected to the first connection node;

first resistor formed between the third connection node and the second power supply port; and two or more loading means formed between each of the two or more reference voltage output nodes and the second power supply port, wherein two or more reference voltage outputs are provided at the two or more reference voltage output nodes.

32. A reference voltage generator as recited in claim 31, wherein the first and second power supplies are power supply voltage and ground power supply, respectively.

33. A reference voltage generator as recited in claim 31, wherein each of the first, second, and two or more additional pull-up transistors comprise an insulating gate field effect transistors having a P-type channel.

* * * * *